(12) United States Patent
Zhang et al.

(10) Patent No.: US 11,676,865 B2
(45) Date of Patent: Jun. 13, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Zhenyang Zhao, Shanghai (CN); Enning Zhang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 62 days.

(21) Appl. No.: 17/243,776

(22) Filed: Apr. 29, 2021

(65) Prior Publication Data
US 2021/0358809 A1 Nov. 18, 2021

(30) Foreign Application Priority Data
May 18, 2020 (CN) .......................... 202010420659.8

(51) Int. Cl.
*H01L 21/8234* (2006.01)
*H01L 27/088* (2006.01)

(52) U.S. Cl.
CPC ........... *H01L 21/823431* (2013.01); *H01L 21/823481* (2013.01); *H01L 27/0886* (2013.01)

(58) Field of Classification Search
CPC ....... H01L 21/823431; H01L 29/78642; H01L 29/7827; H01L 29/66666; H01L 27/0886
See application file for complete search history.

(56) References Cited

U.S. PATENT DOCUMENTS

| | | | |
|---|---|---|---|
| 10,439,045 B1 * | 10/2019 | Yamashita | H01L 29/7848 |
| 2002/0137271 A1 * | 9/2002 | Forbes | H01L 29/66825 257/E29.302 |
| 2019/0051563 A1 * | 2/2019 | Park | H01L 21/823431 |
| 2019/0051659 A1 * | 2/2019 | Xie | H01L 27/11526 |
| 2019/0198643 A1 * | 6/2019 | Chan | H01L 29/6653 |

\* cited by examiner

*Primary Examiner* — Tuan A Hoang
(74) *Attorney, Agent, or Firm* — Anova Law Group, PLLC (57) ABSTRACT

Semiconductor structures and fabrication methods thereof are provided. The method includes providing a substrate; forming a stacked material structure on the substrate; and forming trenches in the stacked material structure. Bottoms of the trenches are in the first material layer, the trenches are arranged along a first direction and form an initial stacked structure sequentially including an initial first layer, an initial second layer and an initial third layer. The method also includes etching the initial third layer to form transitional third layers arranged along a second direction perpendicular to the first direction; removing a portion of the initial first layer and a portion of the initial second layer of the initial stacked structure at two sides along the second direction to form a stacked structure including a first layer, a second layer and the transitional third layers; and forming a gate structure.

17 Claims, 7 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202010420659.8, filed on May 18, 2020, the content of which is incorporated by reference in its entirety.

TECHNICAL FIELD

The present disclosure generally relates to the field of semiconductor manufacturing technology and, more particularly, relates to semiconductor structures and fabrication methods.

BACKGROUND

In the field of semiconductor, vertical field-effect transistors (VFET) are widely used. Vertical transistors provide a smaller layout area than previously designed transistors, and the device packaging density is increased. The vertical field-effect transistor includes a channel perpendicular to the surface of the substrate, instead of being arranged along the plane of the substrate surface. Thus, the gate length is not limited by the lateral line width but by the vertical thickness of the layer. Accordingly, the vertical transistor allows to greatly reduce gate length, and the short channel effect associated with planar devices is reduced.

Vertical transistors have various structures, and there is a need to develop a new method for forming the vertical transistors. The disclosed methods and semiconductor structures are directed to solve one or more problems set forth above and other problems in the art.

SUMMARY

One aspect of the present disclosure provides a method for forming a semiconductor structure. The method includes providing a substrate; forming a stacked material structure including a first material layer, a second material layer on the first material layer and a third material layer on the second material layer on the substrate; and forming a plurality of trenches in the stacked material structure. Bottoms of the plurality of trenches are in the first material layer, the plurality of trenches are arranged along a first direction that is parallel to a surface of the substrate to form an initial stacked structure, and the initial stacked structure includes an initial first layer, an initial second layer on the initial first layer and an initial third layer on the initial second layer. The method also includes etching the initial third layer to form a plurality of transitional third layers arranged along a second direction that is parallel to the surface of the substrate and perpendicular to the first direction; removing a portion of the initial first layer and a portion of the initial second layer of the initial stacked structure at two sides along the second direction to form a stacked structure after forming the plurality of transitional third layers. The stacked structure includes a first layer, a second layer on the first layer and the plurality of transitional third layers on the second layer. Further, the method includes forming a gate structure on a portion of the stacked structure.

Optionally, the first layer includes a first portion and a second portion on the first portion; the first portion has a first projection on the substrate; the second portion has a second projection of the substrate; an area of the first projection is greater than an area of the second projection; and the second projection is within the first projection.

Optionally, after forming the initial stacked structure and before forming the plurality of transitional third layers, the method further includes forming an insulation structure in the plurality of trenches. The isolation structure exposes sidewall surfaces of the initial third layer, and a top surface of the isolation structure is lower than, or levels with a bottom surface of the initial third layer.

Optionally, the method for forming the gate structure on a portion of the stacked structure includes forming the gate structure on a surface of the stacked structure exposed by the isolation structure.

Optionally, the method for forming the plurality of transitional third layers includes forming a first liner layer on the isolation structure, wherein the first liner layer is on a top surface and sidewall surfaces of the initial third layer; forming a second mask layer on the first liner layer, wherein patterns of the second mask layer are arranged along the second direction; etching the initial third layer using the second mask layer as a mask until a surface of the second layer is exposed to form the plurality of transitional third layers; and removing the second mask layer and the first liner layer after forming the plurality of transitional third layers.

Optionally, the method for forming the isolation structure includes forming an isolation material layer on the initial stacked structure; planarizing the isolation material layer until a top surface of the initial stacked structure is exposed to form an initial isolation layer; etching back the initial isolation layer until the initial third layer is completely exposed to form a transitional isolation structure; and removing portions of the transitional isolation structure on sidewall surfaces of the initial first layer and the initial second layer along the second direction to form the isolation structure.

Optionally, the isolation structure includes a dielectric material; and the dielectric material includes silicon oxide.

Optionally, the gate structure includes a gate dielectric layer on a surface of the second layer and a gate electrode layer on the gate dielectric layer.

Optionally, the method further includes forming an interlayer dielectric layer between the second layer and the gate dielectric layer; and forming a work function layer between the gate dielectric layer and the gate electrode layer.

Optionally, after forming the stacked structure, the method further includes thinning the plurality of transitional third layers along a direction perpendicular to sidewall surfaces of the plurality of transitional third layers.

Optionally, the method for thinning the plurality of transitional third layers includes oxidizing surfaces of the plurality of transitional third layers to form an oxide layer; and removing the oxide layer.

Optionally, the method for forming the initial stacked structure includes forming a first mask layer on the stacked material structure, wherein patterns of the first mask layer are arranged along the first direction; and etching the third material layer, the second material layer and a portion of the first material layer using the first mask layer as a mask to form the initial stacked structure on the substrate.

Optionally, the method for removing the initial first layer and the initial second layer at the two sides along the second direction includes forming a second liner layer on the initial second layer, wherein the second liner layer is on top surfaces and sidewall surfaces of the plurality of transitional third layers; forming a third mask layer on the second liner layer, wherein the third mask layer exposes portions of a top surface of the second layer at the two sides along the second direction; etching the second liner layer, the initial second layer and the initial first layer using the third mask layer as a mask to form the stacked structure; and removing the second liner layer and the third mask layer after forming the stacked structure.

Optionally, a material of the first layer includes a semiconductor material and the semiconductor material includes one of silicon and silicon germanium; a material of the second layer includes a semiconductor material and the semiconductor material includes one of silicon and silicon germanium; and a material of the plurality of transitional third layers includes a semiconductor material and the semiconductor material includes one of silicon and silicon germanium.

Optionally, the first layer includes a first type of ions and the first type of ions include N-type of ions or P-type of ions; the second layer includes a second type of ions and the second type of ions include N-type of ions or P-type of ions; the N-type of ions include phosphor ions or arsenic ions; and the P type of ions include boron ions or boron fluoride ions.

Optionally, an ion type of the first type of ions is opposite to an ion type of the second type of ions.

Optionally, the plurality of trenches pass through the initial stacked structure along the second direction that is parallel to the surface of the substrate; and the second direction is perpendicular to the first direction.

Another aspect of the present disclosure provides a semiconductor structure. The semiconductor structure includes a substrate; and a stacked structure on the substrate. The stacked structure includes a first layer, a second layer on the first layer and a plurality of third layers on the second layer; the first layer includes a first portion and a second portion on the first portion; the first portion has a first projection on the substrate; the second portion has a second projection on the substrate; an area of the first projection is greater than an area of the second projection, the second projection is within the first projection; the second layer is on the second portion of the first layer; and the plurality of third layers are arranged along a first direction that is parallel to a surface of the substrate. The semiconductor structure also includes a plurality of trenches in the stacked structure. Bottoms of the plurality of trenches are in the first layer; the plurality of trenches are distributed along a second direction that is parallel to the surface of the substrate; the second direction is perpendicular to the first direction; and the plurality of trenches pass through the stacked structure along the first direction. Further, the semiconductor structure includes an isolation structure in the plurality of trenches. The isolation structure exposes sidewall surfaces of the plurality of third layers; and a top surface of the isolation structure is lower than or levels with the bottoms of the plurality of the third layers. Further, the semiconductor structure includes a gate structure on a portion of the stacked structure exposed by the isolation structure.

Optionally, the semiconductor structure is formed by providing the substrate; forming a stacked material structure including a first material layer, a second material layer on the first material layer and a third material layer on the second material layer on the substrate; forming the plurality of trenches in the stacked material structure, wherein bottoms of the plurality of trenches are in the first material layer, the plurality of trenches are arranged along a first direction that is parallel to a surface of the substrate and form an initial stacked structure, and the initial stacked structure includes an initial first layer, an initial second layer on the initial first layer and an initial third layer on the initial second layer; etching the initial third layer to form a plurality of transitional third layers, wherein the plurality of transitional third layers are arranged along a second direction that is parallel to the surface of the substrate and the second direction is perpendicular to the first direction; after forming the plurality of transitional third layers, removing a portion of the initial first layer and a portion of the initial second layer of the initial stacked structure at two sides along the second direction to form a stacked structure, wherein the stacked structure includes a first layer, a second layer on the first layer and the transitional third layer on the second layer; and forming a gate structure on a portion of the stacked structure.

Optionally, a thickness of the first portion is in a range of approximately 10 nm-100 nm; a thickness of the second portion is in a range of approximately 10 nm-100 nm; and a thickness of the second layer is in a range of approximately 10 nm-100 nm.

The present disclosure may have the following beneficial effects.

In the method for forming a semiconductor structure, the semiconductor structure may have a strong channel control ability and substantially high integration, and may be applied to the advanced semiconductor technology.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
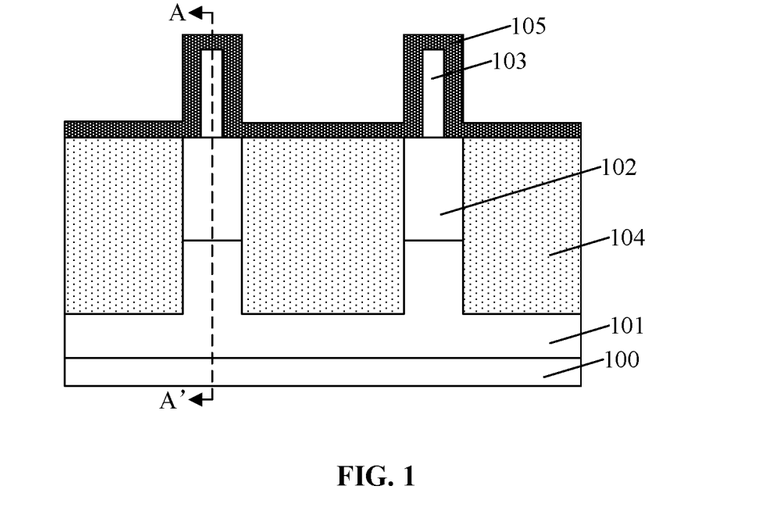
FIGS. 1-2 illustrate cross-sectional views of an exemplary semiconductor structure consistent with various disclosed embodiments of the present disclosure.
Figure 2:
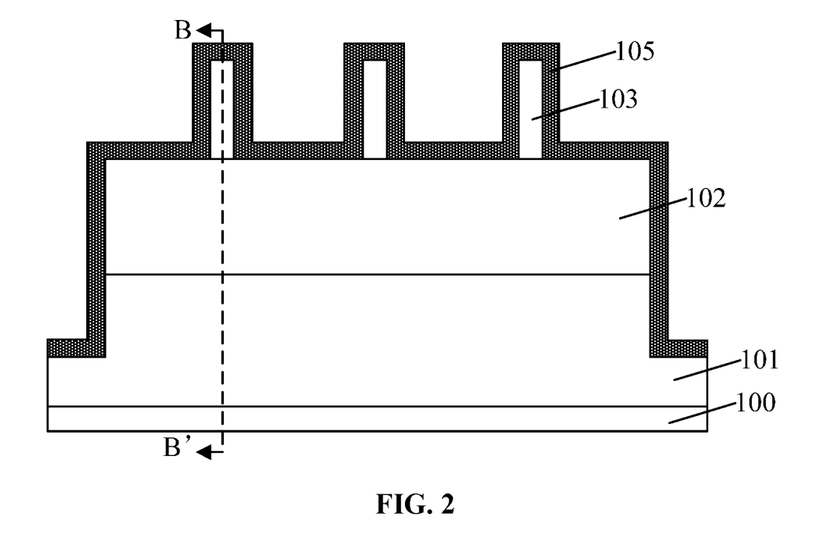

The present disclosure provides a semiconductor structure. FIGS. 1-2 illustrate cross-sectional views of an exemplary semiconductor structure consistent with various disclosed embodiments of the present disclosure. FIG. 1 is a BB'-sectional view of FIG. 2, and FIG. 2 is an AA'-sectional view of FIG. 1.

As shown in FIGS. 1-2, the semiconductor structure may include a substrate 100 and a stacked structure on the substrate 100. The stacked structure may include a first layer 101, a second layer 102 on the first layer 101, and a plurality of third layers 103 on the second layer 102. The first layer 101 may include a first portion (not labeled) and a second portion (not labeled) located on the first portion. The first portion may have a first projection on the substrate 100, and the second portion may have a second projection on the substrate 100. The area of the first projection may be greater than the area of the second projection, and the second projection may be within the range of the first projection.

The second layer 102 may be located on the second portion of the first layer 101. The plurality of third layers 103 may be arranged along a first direction that is parallel to the surface of the substrate 100. The semiconductor structure may also include a plurality of trenches (not shown) formed in the stacked structure. The bottoms of the trenches may be located in the first layer 101, and the plurality of trenches may be arranged along a second direction that is parallel to the surface of the substrate 100. The second direction may be perpendicular to the first direction. Along the first direction parallel to the surface of the substrate 100, the plurality of the trenches may pass through the stacked structure. Further, the semiconductor structure may include an isolation structure 104 in the plurality of trenches. The isolation structure 104 may expose the sidewall surfaces of the plurality of third layers 103, and the top surface of the isolation structure 104 may be lower than or flush with the bottom plane of the third layers 103. Further, the semiconductor structure may include a gate structure on the surface of the stacked structure exposed by the isolation structure 104.

The semiconductor structure may have a strong channel control ability and substantially high integration, and may be applied to the advanced semiconductor technology.

Figure 16:
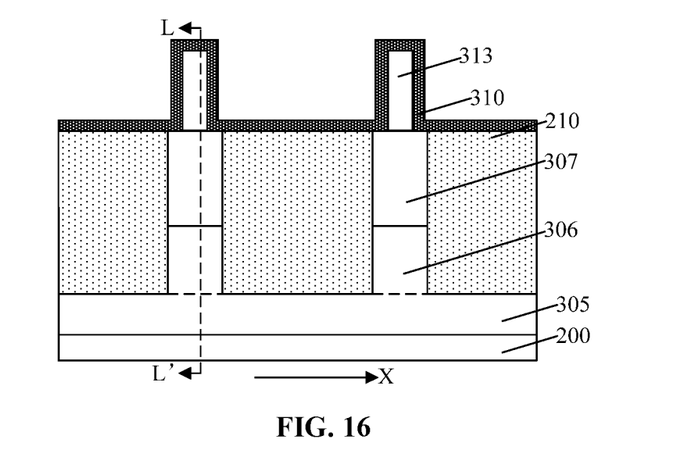
Figure 17:
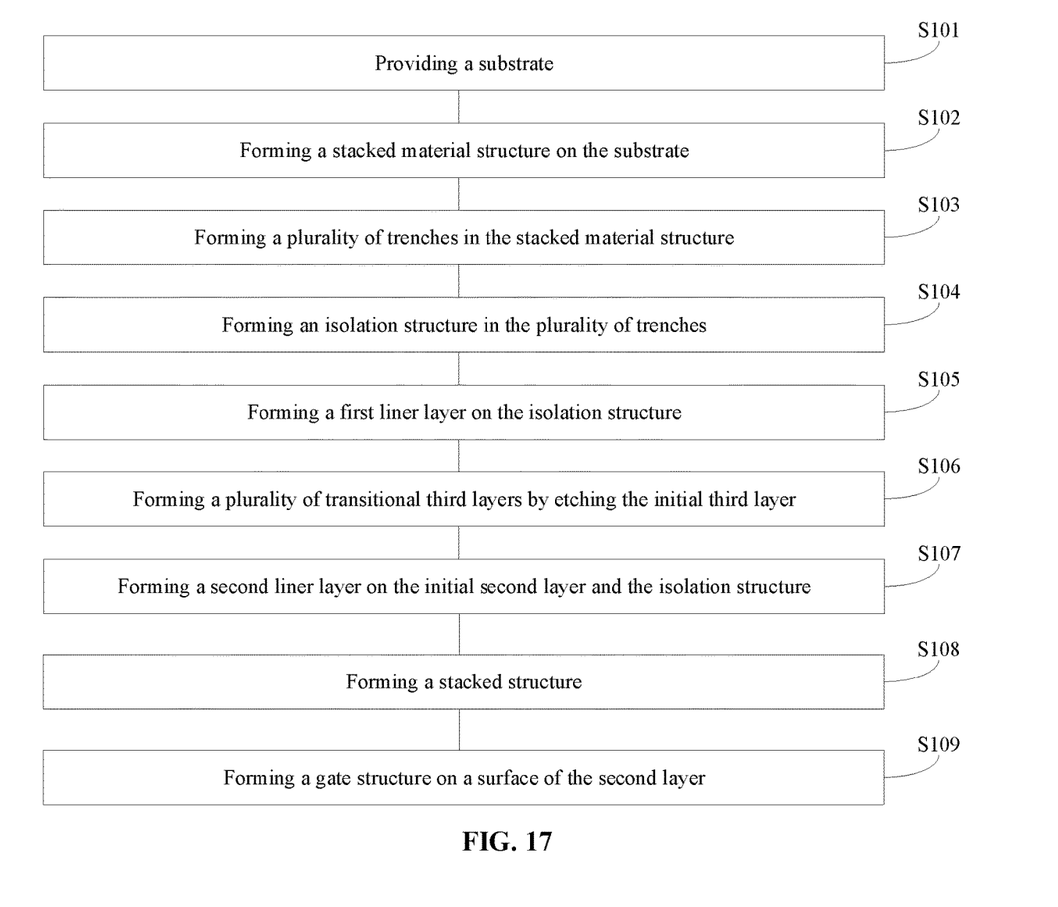
FIG. 17 illustrates an exemplary fabrication process of a semiconductor structure consistent with various disclosed embodiments of the present disclosure.

The present disclosure also provides a method for forming the above-mentioned semiconductor structure and other appropriate semiconductor structure. FIG. 17 illustrates an exemplary fabrication method of a semiconductor structure consistent with various disclosed embodiments of the present disclosure. FIGS. 3-16 are schematic cross-sectional structures corresponding to certain stages during the exemplary fabrication process consistent with various disclosed embodiments of the present disclosure.

Figure 3:
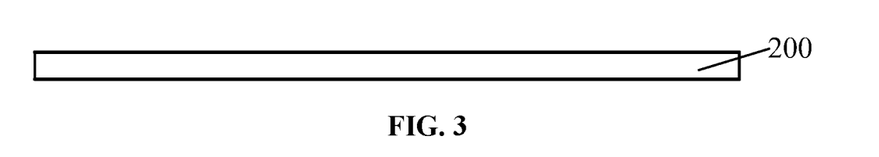
FIGS. 3-16 illustrate structures corresponding to certain stages during an exemplary fabrication process of a semiconductor structure consistent with various disclosed embodiments of the present disclosure.

As shown in FIG. 17, at the beginning of the fabrication process, a substrate is provided (S101). FIG. 3 illustrates a corresponding structure.

As shown in FIG. 3, a substrate 200 is provided. In one embodiment, the material of the substrate 200 is silicon. In some embodiments, the material of the substrate may include silicon carbide, silicon germanium, compound semiconductor material composed of group III-V elements, silicon-on-insulator (SOI), or germanium-on-insulator (GOI), etc. Among them, the compound semiconductor material composed of group III-V elements may include InP, GaAs, GaP, InAs, InSb, InGaAs, or InGaAsP, etc.

Figure 4:
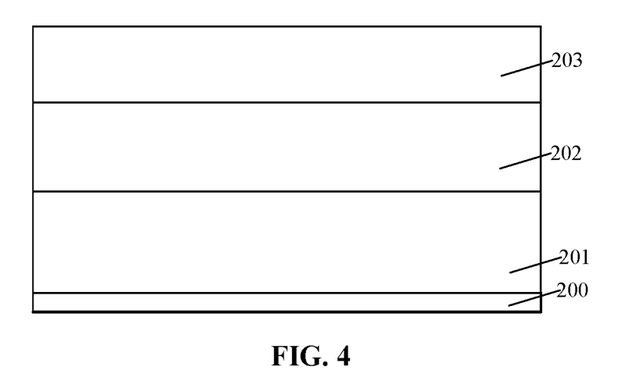

Returning to FIG. 17, after providing the substrate, a stacked material structure may be formed (S102). FIG. 4 illustrates a corresponding structure.

As shown in FIG. 4, a stacked material structure may be formed on the substrate 200. The stacked material structure may include a first material layer 201, a second material layer 202 on the first material layer 201, and a third material layer 203 on the second material layer 202.

The first material layer 201 may provide a material layer for the subsequently formed first layer. The second material layer 202 may provide a material layer for the subsequently formed second layer. The third material layer 203 may provide a material layer for the subsequently formed third layer.

The material of the first material layer 201 may include a semiconductor material, and the semiconductor material may include silicon, or silicon germanium, etc. The material of the second material layer 202 may include a semiconductor material, and the semiconductor material may include silicon, or silicon germanium, etc. The material of the third material layer 203 may include a semiconductor material, and the semiconductor material may include silicon, or silicon germanium, etc.

The first material layer 201 may include a first type of ions, and the first type of ions may include N-type ions, or P-type ions. The second material layer 202 may include a second type of ions; and the second type of ions may include N-type ions, or P-type ions. The N-type ions may include phosphorus ions, or arsenic ions, etc. The P-type ions may include boron ions, or boron fluoride ions, etc.

In one embodiment, the ion type of the first type of ions may be opposite to the ion type of the second type of ions.

The ion type of the first type of ions and the ion type of the second type of ions are opposite such that, in the subsequently formed semiconductor structure, the first layer and the second layer may form a PN junction, and the circuit of the formed semiconductor structure may be turned on/off.

Figure 5:
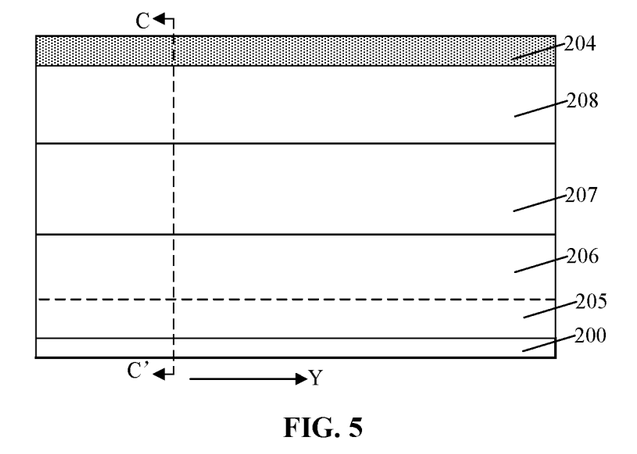
Figure 6:
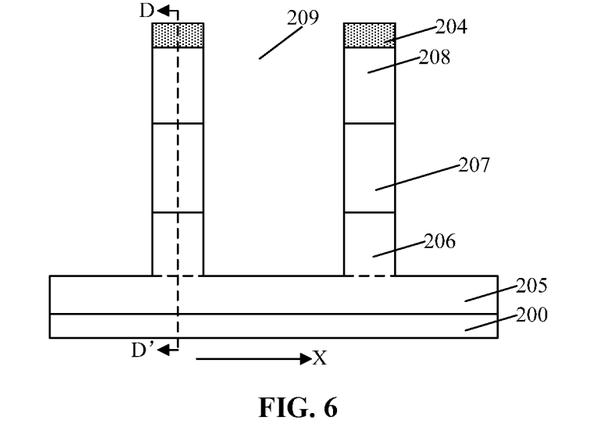

Returning to FIG. 17, after forming the stacked material structure, a plurality of trenches may be formed (S103). FIGS. 5-6 illustrate a corresponding structure. FIG. 6 is a CC'-sectional view of FIG. 5, and FIG. 5 is a DD'-sectional view of FIG. 6.

As shown in FIGS. 5-6, a plurality of trenches 209 may be formed in the stacked material structure. The bottom of the trench 209 may be located in the first material layer 201, and the plurality of trenches 209 may be arranged along a first direction X that is parallel to the surface of the substrate 200 and form an initial stacked structure. The initial stacked structure may include an initial first layer, an initial second layer 207 on the initial first layer, and an initial third layer 208 on the initial second layer 207.

Along a second direction Y that is parallel to the surface of the substrate 100, the plurality of trenches 209 may pass through the initial stacked structure. The second direction Y may be perpendicular to the first direction X.

Along the first direction X, the width of a trench 209 may be in a range of approximately 20 nm-100 nm.

The initial first layer may include an initial first portion 205 and an initial second portion 206 on the initial first portion 205. The initial first portion 205 may have a first projection on the substrate 200, and the initial second portion 206 may have a second projection on the substrate 200. The area of the first projection may be greater than the area of the second projection, and the second projection may be located within the range of the first projection.

The method for forming the initial stacked structure may include forming a first mask layer 204 on the stacked material structure. The patterns of the first mask layer 204 may be arranged along the first direction X. Then, the third material layer 203, the second material layer 202 and a portion of the first material layer 201 may be etched using the first mask layer 204 as an etching mask to form the initial stacked structure on the substrate 200.

The material of the first mask layer 204 may include a dielectric material, and the dielectric material may include one or more of silicon oxide, silicon nitride, silicon oxynitride, aluminum oxide, aluminum nitride, silicon carbonitride, and silicon oxycarbonitride, etc. The process for etching the third material layer 203, the second material layer 202 and the portion of the first material layer 201 may include one or a combination of a dry etching process and a wet etching process, etc.

In one embodiment, the material of the first mask layer 204 may include silicon nitride; and the process for etching the third material layer 203, the second material layer 202 and the portion of the first material layer 201 may include a dry etching process.

The first mask layer 204 may also protect the top surface of the formed initial third layer 208.

The thickness of the initial first portion 205 may be in a range of approximately 10 nm-100 nm. The thickness of the initial second portion 206 may be in a range of approximately 10 nm-100 nm.

Figure 7:
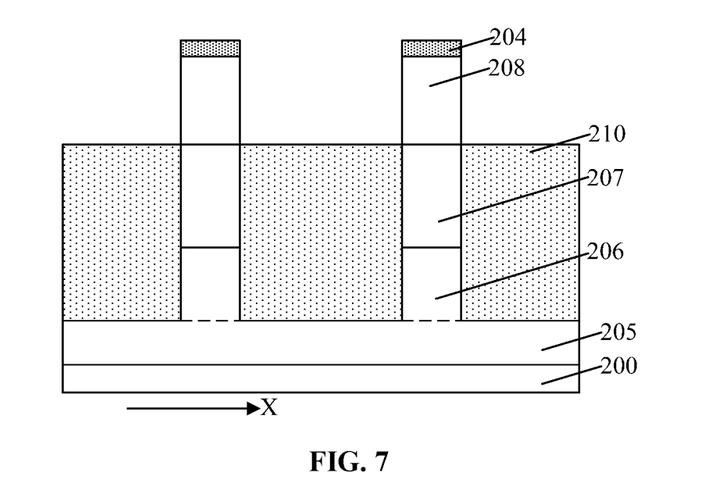

Returning to FIG. 17, after forming the plurality of trenches, an isolation structure may be formed (S104). FIG. 7 illustrates a corresponding structure which is based on FIG. 6.

As shown in FIG. 7, an isolation structure 210 is formed in the plurality of trenches 209, and the isolation structure 210 may expose the sidewall surfaces of the initial third layer 208, and the top surface of the isolation structure 210 may be lower than or flush with the bottom plane of the initial third layer 208.

The isolation structure 210 may be used to protect the initial first layer and the initial second layer 207 such that the initial first layer and the initial second layer 207 may not be damaged during the subsequent formation of the third layers.

The method for forming the isolation structure 210 may include forming an isolation material layer (not shown) on the initial stacked structure; planarizing the isolation material layer until the top surface of the initial stacked structure is exposed to form an initial isolation layer (not shown); etching back the initial isolation layer until the initial third layer 208 is completely exposed to form a transitional isolation structure (not shown); removing the transitional isolation structure on the sidewall surfaces of the initial first layer and the initial second layer 207 along the second direction Y to form the isolation structure 210.

The material of the isolation structure 210 may include a dielectric material, and the dielectric material may include one or more of silicon oxide, silicon nitride, silicon oxynitride, aluminum oxide, aluminum nitride, silicon carbonitride, and silicon oxycarbonitride, etc. In one embodiment, the material of the isolation structure 210 may include silicon oxide.

Figure 8:
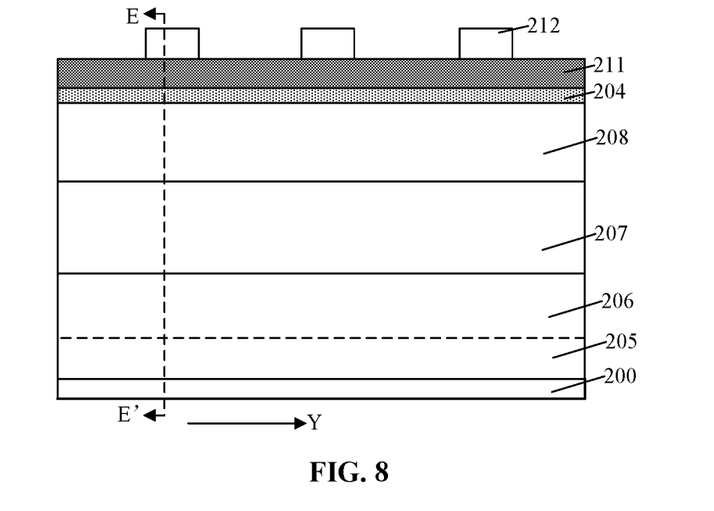
Figure 9:
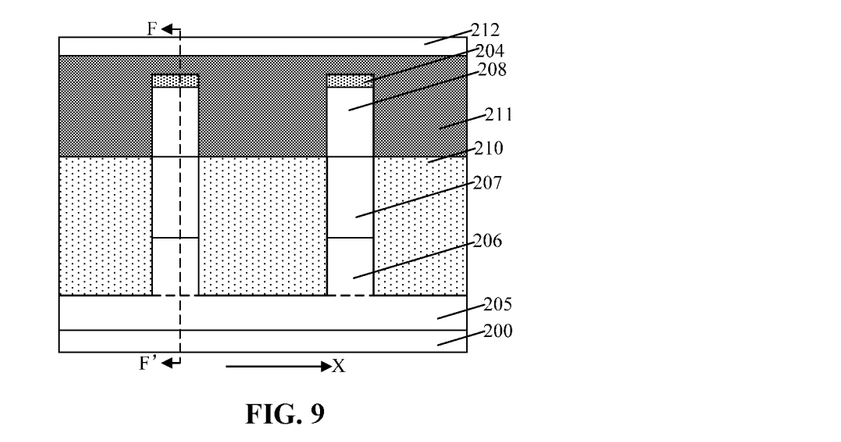
Figure 10:
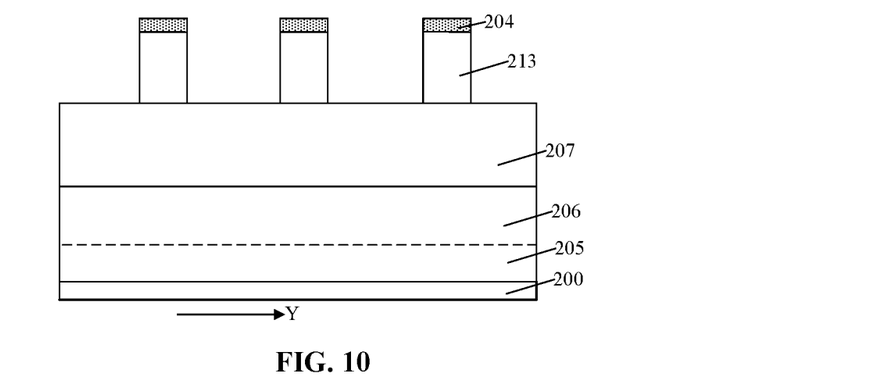

After forming the isolation structure 210, the initial third layer 208 may be etched to form a plurality of transitional third layers 213 on the initial second layer 207, and the plurality of transitional third layers 213 may be arranged along the second direction Y that is parallel to the surface of the substrate 200. The second direction Y may be perpendicular to the first direction X. FIGS. 8-10 illustrate structures corresponding to certain stages during forming the transitional third layers 213.

Returning to FIG. 17, after forming the isolation structure, a first liner layer may be formed (105). FIGS. 8-9 illustrate a corresponding structure. FIG. 9 is an EE'-sectional view of FIG. 8; and FIG. 8 is an FF'-sectional view of FIG. 9.

As shown in FIGS. 8-9, a first liner layer 211 may be formed on the isolation structure 210. The first liner layer 211 may be formed on the top surface and sidewall surfaces of the initial third layer 208.

Further, a second mask layer 212 may be formed on the first liner layer 211. The patterns of the second mask layer 212 may be arranged along the second direction Y.

The first liner layer 211 may provide a structural support for the second mask layer 212. The material of the first liner layer 211 may include an organic material or an inorganic material, etc. The organic material may include amorphous carbon; and the inorganic material may include amorphous silicon. In one embodiment, the material of the first liner layer 211 includes amorphous carbon; and the material of the second mask layer 212 includes photoresist.

Returning to FIG. 17, after forming the second mask layer, a plurality of transitional third layers may be formed (S106). FIG. 10 illustrates a corresponding structure based on the FIG. 8.

As shown in FIG. 10, after forming the second mask layer 212, the initial third layer 208 may be etched until the surface of the initial second layer 207 is exposed using the second mask layer 212 as a mask; and the transitional third layers 213 may be formed.

The process of etching the initial third layer 208 may include one or a combination of a dry etching process and a wet etching process. In one embodiment, the process for etching the initial third layer 208 includes a dry etching process, and the dry etching process may form the transitional third layers 213 with a desired sidewall morphology.

Further, referring to FIG. 10, after forming the transitional third layers 213, the second mask layer 212 and the first liner layer 211 may be removed. In one embodiment, the process for removing the second mask layer 212 may include an ashing process; and the process for removing the first liner layer 211 may include a dry etching process.

After the transitional third layers 213 are formed, a portion of the initial first layer and a portion of the initial second layer 207 on two sides of the initial stacked structure along the second direction Y may be removed to form a stacked structure. The stacked structure may include a first layer, a second layer 307 on the first layer and the transitional third layers 213 on the second layer 307. FIGS. 11-14 illustrate structures corresponding to certain stages during the formation process of the stacked structure.

Figure 11:
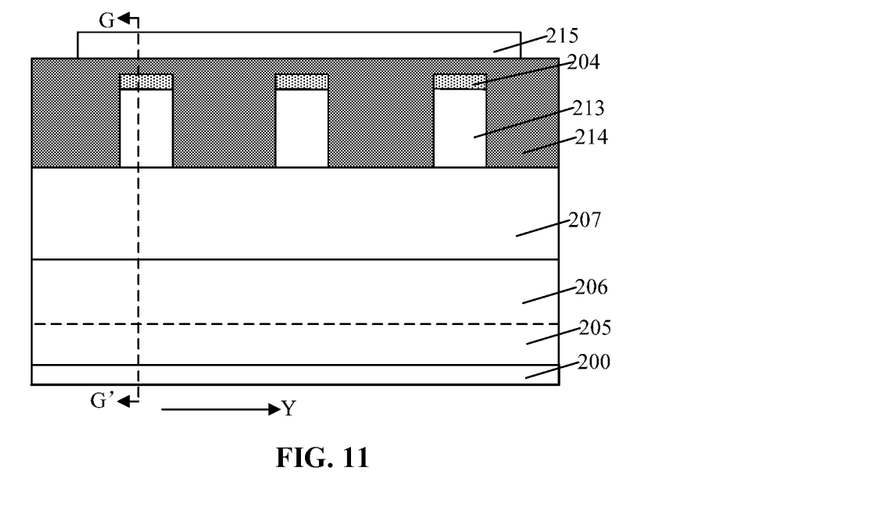
Figure 12:
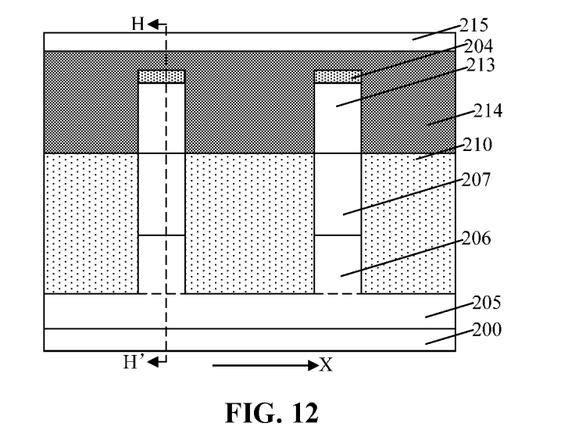

Returning to FIG. 17, after forming the transitional third layers, a second liner layer may be formed (107). FIGS. 11-12 illustrate a corresponding structure. FIG. 12 is a GG'-sectional view of FIG. 11; and FIG. 11 is a HH'-sectional view of FIG. 12.

As shown in FIGS. 11-12, a second liner layer 214 may be formed on the initial second layer 207 and the isolation structure 210. The second liner layer 214 may be formed on the top surfaces and the sidewall surfaces of the transitional third layers 213.

Further, a third mask layer 215 may be formed on the second liner layer 214. The third mask layer 215 may expose a portion of the top surface of the initial second layer 207 at the two sides along the second direction Y, and the third mask layer 215 may be within the initial second layer 207.

The second liner layer 214 may provide a structural support for the third mask layer 215. The material of the second liner layer 214 may include an organic material, or an inorganic material, etc. The organic material may include amorphous carbon, etc., and the inorganic material may include amorphous silicon, etc. In one embodiment, the material of the second liner layer 214 includes amorphous carbon; and the material of the third mask layer 215 includes photoresist.

Figure 13:
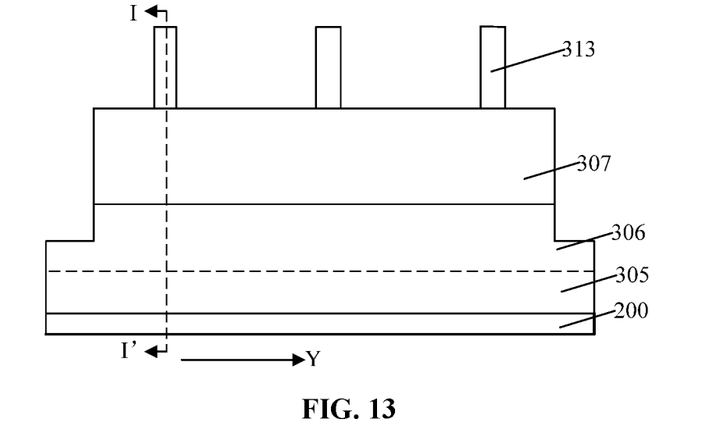
Figure 14:
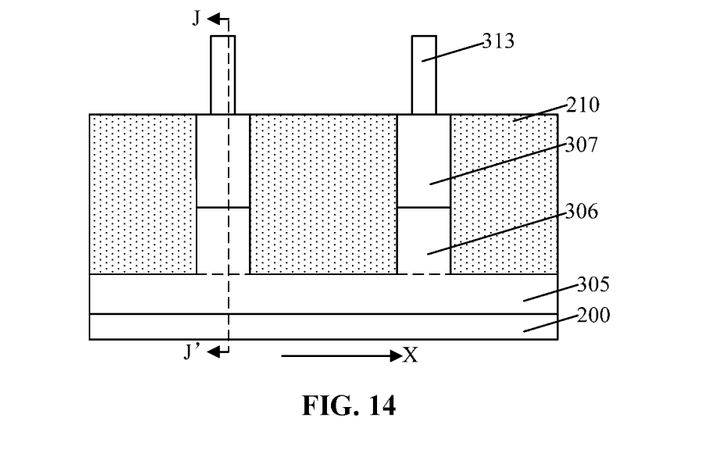

Returning to FIG. 17, after forming the second liner layer, a stacked structure may be formed (S108). FIGS. 13-14 illustrate a corresponding structure. FIG. 14 is an II'-sectional view of FIG. 13; and FIG. 13 is a JJ'-sectional view of FIG. 14.

As shown in FIGS. 13-14, the second liner layer 214, the initial second layer 207, and the initial first layer may be etched using the third mask layer 215 as an etching mask such that the initial second layer 207 may be formed into the second layer 307, the initial first portion 205 may be formed into a first portion 305; and the initial second portion 206 may be formed into the second portion 306 to form the stacked structure. The stacked structure may include the first layer, the second layer 307 on the first layer, and the transitional third layers 213 on the second layer 307.

The first layer may include the first portion 305 and the second portion 306 on the first portion 305. The first portion 305 may have a first projection on the substrate 200, and the second portion 306 may have a second projection on the substrate 200. The area of the first projection may be greater than the area of the second projection, and the second projection may be located within the range of the first projection.

The area of the first projection may be greater than the area of the second projection, and the second projection may be located within the range of the first projection. Thus, when a conductive structure electrically connected to the first layer is subsequently formed, the conductive structure may be easy to connect with the second portion 306, and the formation process of the conductive structure may be relatively simple.

In one embodiment, the thickness of the second layer 307 may be in range of approximately 10 nm-100 nm.

After forming the stacked structure, the second liner layer 214 and the third mask layer 215 may be removed. In one embodiment, the process for removing the third mask layer 215 may include an ashing process; and the process for removing the second liner layer 214 may include a dry etching process.

Further, referring to FIG. 13 and FIG. 14, after forming the stacked structure, the method may further include thinning the transitional third layers 213 along the direction perpendicular the sidewall surface of the transitional third layers 213 to form the third layers 313.

The method for thinning the transitional third layers 213 may include oxidizing the surfaces of the transitional third layers 213 to form an oxide layer (not shown); and removing the oxide layer. The process for removing the oxide layer may include one or a combination of a dry etching process and a wet etching process.

Thinning the transitional third layers 213 may further reduce the size of the transitional third layers 213. Thus, the issue that the size of the transitional third layers 213 may not be small caused by the limitation of the photolithography process when the transitional third layers 213 are formed may be made up.

In one embodiment, along the first direction X, the size of the third layer 313 may be in a range of approximately 5 nm-50 nm. Along the second direction Y, the size of the third layer 313 may be in a range of approximately 5 nm-50 nm.

In some embodiments, the transitional third layers may not be thinned.

Figure 15:
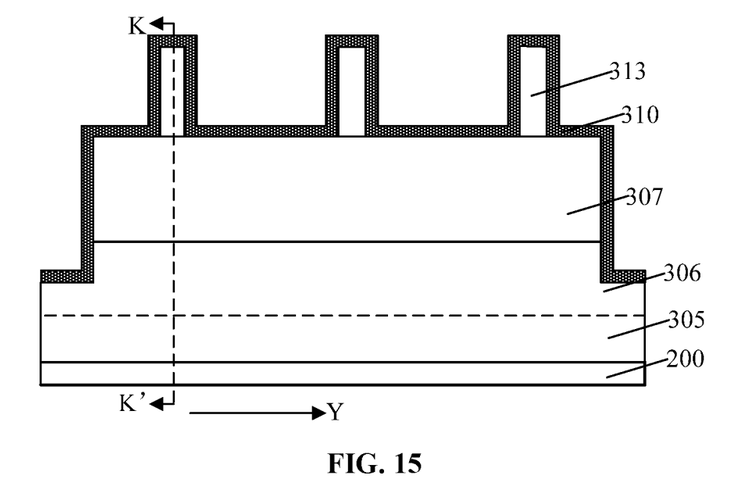

Returning to FIG. 17, after thinning the transitional third layers, a gate structure may be formed (S109). FIGS. 15-16 illustrate a corresponding structure. FIG. 16 a KK'-sectional view of FIG. 15, and FIG. 15 is an LL'-sectional view of FIG. 16.

As shown in FIGS. 15-16, a gate structure 310 may be formed on the surface of the second layer 307. The gate structure 310 may include a gate dielectric layer (not shown) on the surface of the second layer 307 and a gate electrode layer (not shown) on the gate dielectric layer.

The method for forming the gate structure 310 may include forming the gate structure 310 on the surface of the stacked structure exposed by the isolation structure 210.

In one embodiment, an interlayer dielectric layer (not shown) may be formed between the second layer and the gate dielectric layer; and a work function layer (not shown) may be between the gate dielectric layer and the gate electrode layer.

The material of the gate dielectric layer may include a high dielectric constant material. The dielectric constant of the high dielectric constant material may be greater than 3.9. The high dielectric constant material may include aluminum oxide, or hafnium oxide. The material of the gate electrode layer may include metal. The metal may include tungsten, etc. The material of the work function layer may include an N-type work function material, or a P-type work function material. The N-type work function material may include titanium aluminum, and the P-type work function material may include nitride titanium nitride, or tantalum nitride. The material of the interlayer dielectric layer may include a low dielectric constant material. The dielectric constant of the low dielectric constant material may be less than or equal to 3.9. The low dielectric constant material may include silicon oxide.

The semiconductor structure formed by the present disclosed method may have a strong channel control capability and a high integration, and may be applied to advanced semiconductor technology.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor structure, comprising:
   providing a substrate;
   forming a stacked material structure, including a first material layer, a second material layer on the first material layer, and a third material layer on the second material layer, on the substrate;
   forming a plurality of trenches in the stacked material structure, wherein bottoms of the plurality of trenches are in the first material layer, the plurality of trenches are arranged along a first direction that is parallel to a surface of the substrate and form an initial stacked structure, and the initial stacked structure includes an initial first layer, an initial second layer on the initial first layer, and an initial third layer on the initial second layer;
   etching the initial third layer to form a plurality of transitional third layers, wherein the plurality of transitional third layers are arranged along a second direction that is parallel to the surface of the substrate and the second direction is perpendicular to the first direction;
   after forming the plurality of transitional third layers, removing a portion of the initial first layer and a portion of the initial second layer of the initial stacked structure at two sides along the second direction to form a stacked structure, wherein the stacked structure includes a first layer, a second layer on the first layer, and the plurality of transitional third layers on the second layer; and
   forming a gate structure on a portion of the stacked structure.

2. The method according to claim 1, wherein:
   the first layer includes a first portion and a second portion on the first portion;
   the first portion has a first projection on the substrate;

the second portion has a second projection on the substrate;

an area of the first projection is greater than an area of the second projection; and the second projection is within the first projection.

3. The method according to claim 1, after forming the initial stacked structure and before forming the plurality of transitional third layers, further comprising:

forming an insulation structure in the plurality of trenches;

wherein the isolation structure exposes sidewall surfaces of the initial third layer, and a top surface of the isolation structure is lower than, or levels with a bottom surface of the initial third layer.

4. The method according to claim 3, wherein forming the gate structure on the portion of the stacked structure comprises:

forming the gate structure on a surface of the stacked structure exposed by the isolation structure.

5. The method according to claim 3, wherein forming the plurality of transitional third layers comprises:

forming a first liner layer on the isolation structure, wherein the first liner layer is also on a top surface and sidewall surfaces of the initial third layer;

forming a second mask layer on the first liner layer, wherein patterns of the second mask layer are arranged along the second direction;

etching the initial third layer using the second mask layer as a mask until a surface of the second layer is exposed to form the plurality of transitional third layers; and removing the second mask layer and the first liner layer after forming the plurality of transitional third layers.

6. The method according to claim 5, wherein forming the isolation structure comprises:

forming an isolation material layer on the initial stacked structure;

planarizing the isolation material layer until a top surface of the initial stacked structure is exposed to form an initial isolation layer;

etching back the initial isolation layer until the initial third layer is completely exposed to form a transitional isolation structure; and removing portions of the transitional isolation structure on sidewall surfaces of the initial first layer and the initial second layer along the second direction to form the isolation structure.

7. The method according to claim 3, wherein:

the isolation structure includes a dielectric material; and the dielectric material includes silicon oxide.

8. The method according to claim 1, wherein:

the gate structure includes a gate dielectric layer on a surface of the second layer and a gate electrode layer on the gate dielectric layer.

9. The method according to claim 8, wherein:

the gate structure also includes an interlayer dielectric layer between the second layer and the gate dielectric layer and a work function layer between the gate dielectric layer and the gate electrode layer.

10. The method according to claim 1, after forming the stacked structure, further comprising:

thinning the plurality of transitional third layers along a direction perpendicular to sidewall surfaces of the plurality of transitional third layers.

11. The method according to claim 10, wherein thinning the plurality of transitional third layers comprises:

oxidizing surfaces of the plurality of transitional third layers to form an oxide layer; and removing the oxide layer.

12. The method according to claim 1, wherein forming the initial stacked structure comprises:

forming a first mask layer on the stacked material structure, wherein patterns of the first mask layer are arranged along the first direction; and etching the third material layer, the second material layer, and a portion of the first material layer using the first mask layer as a mask to form the initial stacked structure on the substrate.

13. The method according to claim 1, wherein removing the portions of the initial first layer and the initial second layer of the initial stacked structure at the two sides along the second direction comprises:

forming a second liner layer on the initial second layer, wherein the second liner layer is on top surfaces and sidewall surfaces of the plurality of transitional third layers;

forming a third mask layer on the second liner layer, wherein the third mask layer exposes portions of a top surface of the second layer at the two sides along the second direction;

etching the second liner layer, the initial second layer and the initial first layer using the third mask layer as a mask to form the stacked structure; and removing the second liner layer and the third mask layer after forming the stacked structure.

14. The method according to claim 1, wherein:

a material of the first layer includes a semiconductor material and the semiconductor material includes one of silicon and silicon germanium;

a material of the second layer includes a semiconductor material and the semiconductor material includes one of silicon and silicon germanium; and a material of the plurality of transitional third layers includes a semiconductor material and the semiconductor material includes one of silicon and silicon germanium.

15. The method according to claim 1, wherein:

the first layer includes a first type of ions and the first type of ions include N-type of ions or P-type of ions;

the second layer includes a second type of ions and the second type of ions include N-type of ions or P-type of ions;

the N-type of ions include phosphor ions or arsenic ions; and the P type of ions include boron ions or boron fluoride ions.

16. The method according to claim 15, wherein:

an ion type of the first type of ions is opposite to an ion type of the second type of ions.

17. The method according to claim 1, wherein:

the plurality of trenches pass through the initial stacked structure along the second direction that is parallel to the surface of the substrate; and the second direction is perpendicular to the first direction.

* * * * *